United States Patent
Koide et al.

(10) Patent No.: US 6,822,270 B2
(45) Date of Patent: Nov. 23, 2004

(54) SEMICONDUCTOR LIGHT EMITTING DEVICE HAVING GALLIUM NITRIDE BASED COMPOUND SEMICONDUCTOR LAYER

(75) Inventors: Norikatsu Koide, Aichi (JP); Akio Aioi, Hiroshima (JP); Takeshi Nishino, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/360,143

(22) Filed: Feb. 7, 2003

(65) Prior Publication Data

US 2003/0173574 A1 Sep. 18, 2003

(30) Foreign Application Priority Data

Feb. 12, 2002 (JP) ........................................ 2002-033577

(51) Int. Cl.[7] ............................................... H01L 33/00
(52) U.S. Cl. ........................... 257/103; 257/88; 257/91; 257/98; 257/99
(58) Field of Search ............................. 257/88, 91, 98, 257/99, 103, 89, 92, 100, 189

(56) References Cited

U.S. PATENT DOCUMENTS

| | | | | |
|---|---|---|---|---|
| 5,306,924 A | * | 4/1994 | Usami et al. | 257/18 |
| 5,838,029 A | | 11/1998 | Shakuda | |
| 5,959,401 A | | 9/1999 | Asami et al. | |
| 6,410,939 B1 | | 6/2002 | Koide et al. | |
| 2002/0079498 A1 | | 6/2002 | Koide | |
| 2003/0027099 A1 | * | 2/2003 | Udagawa | 433/79 |

FOREIGN PATENT DOCUMENTS

| | | |
|---|---|---|
| JP | 05-343741 | 12/1993 |
| JP | 09-162444 | 6/1997 |
| JP | 09-266327 | * 10/1997 |
| JP | 2000-277441 | 10/2000 |
| JP | 2002-190621 | 7/2002 |
| JP | 2002-198560 | 7/2002 |
| JP | 2002-305327 | 10/2002 |
| JP | 2003-8059 | 1/2003 |

OTHER PUBLICATIONS

Office Action issued Apr. 9, 2004, directed to Chinese Patent Application No. 03103801.8 filed Feb. 12, 2002, and English translation, fourteen pages.

U.S. patent application Ser. No. 10/286,055, Koide, filed Nov. 2002.

Adachi, M. et al. (2000). "Fabrication of Light Emitting Diodes with GaInN Multi–Quantum Wells on Si (111) Substrate by MOCVD" *Proc. Int. Workshop on Nitride Semiconductors*, IPAP Conference Series 1, IPAP: Tokyo, Japan. pp. 868–871.

* cited by examiner

*Primary Examiner*—Minhloan Tran
*Assistant Examiner*—Tan Tran
(74) *Attorney, Agent, or Firm*—Morrison & Foerster LLP

(57) ABSTRACT

The semiconductor light emitting device has a gallium nitride base compound semiconductor layer expressed by a general formula of $In_xGa_yAl_zN$ ($x+y+z=1, 0 \leq x \leq 1, 0 \leq y \leq 1, 0 \leq z \leq 1$). A second intermediate layer is provided between a GaN layer and a light emitting layer, and the second intermediate layer has a lattice constant closer to that of the light emitting layer than that of the GaN layer. As such, when a substrate such as Si substrate having a smaller coefficient of thermal expansion than the nitride semiconductor film is employed, occurrence of cracks is prevented and good crystallinity of the nitride semiconductor film is assured, and accordingly, a long-life and high-luminance nitride base semiconductor light emitting device is obtained.

12 Claims, 5 Drawing Sheets

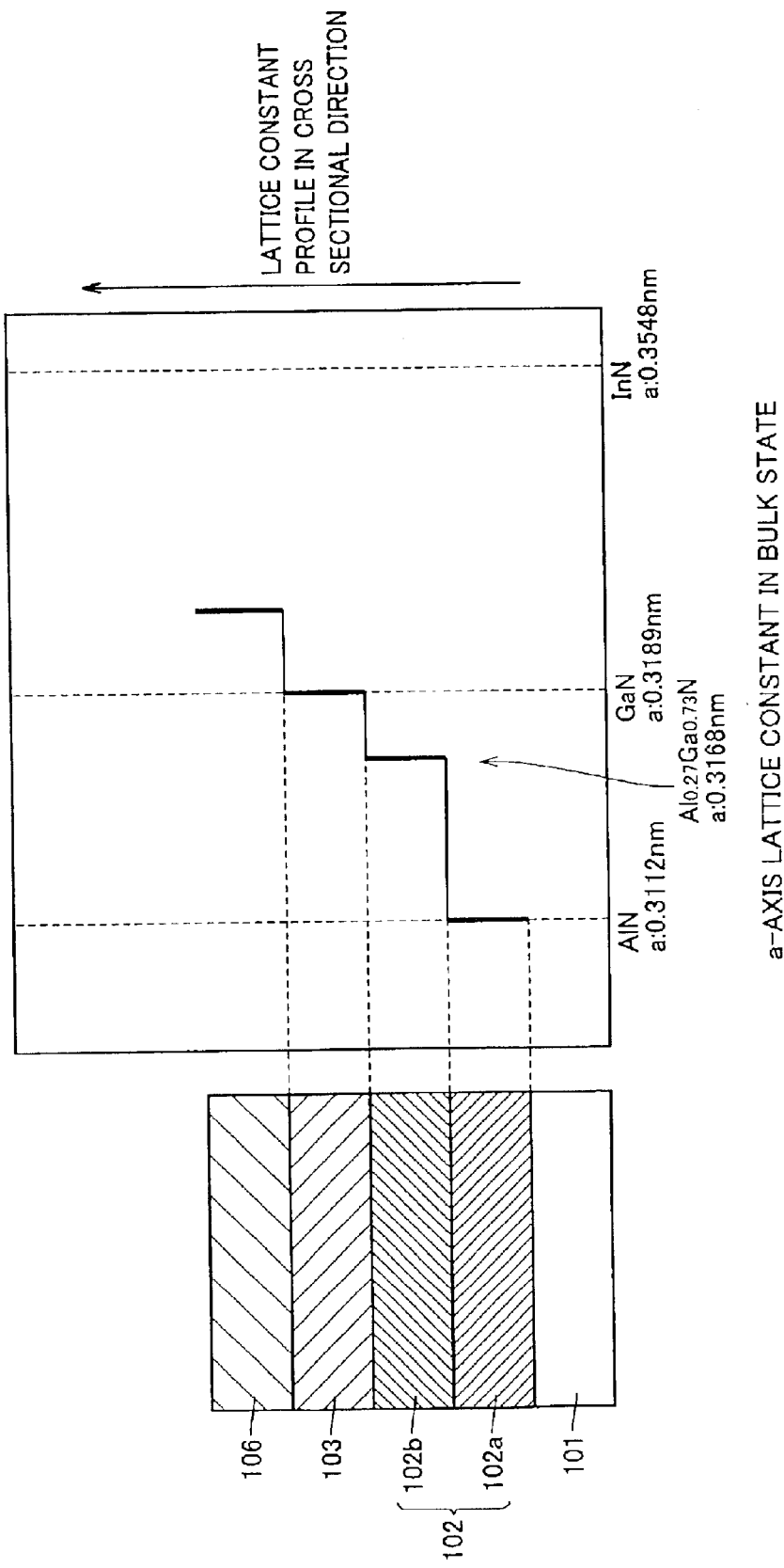

SEMICONDUCTOR LIGHT EMITTING DEVICE HAVING GALLIUM NITRIDE BASED COMPOUND SEMICONDUCTOR LAYER

BACKGROUND OF THE INVENTION

1. Field of the Invention

The present invention relates to semiconductor light emitting devices, and more particularly to a semiconductor light emitting device having as a light emitting layer a gallium nitride base compound semiconductor layer expressed by a general formula of $In_xGa_yAl_zN$ that is provided on a substrate having a smaller coefficient of thermal expansion than GaN, with an intermediate layer interposed therebetween.

2. Description of the Background Art

Of the nitride semiconductor material systems employing GaN, InN, AlN and their mixed crystal semiconductors, a semiconductor light emitting device using $In_xGa_{1-x}N$ crystal as a light emitting layer has conventionally been fabricated employing a sapphire substrate as its substrate primarily.

When a Si substrate is applied to the material system as the substrate, it will be possible to fabricate a less expensive semiconductor light emitting device, because the Si substrate is less expensive than the sapphire substrate and the one having a large area is commercially available.

Here, as an attempt to crystal grow a nitride semiconductor film on the Si substrate, providing a BAlGaInN base single-layer or multi-layer structure as an intermediate layer to fabricate a nitride base semiconductor light emitting device has been disclosed in Japanese Patent Laying-Open Nos. 5-343741 and 2000-277441.

Further, the following publication 1 describes a way of fabricating a nitride base semiconductor light emitting device by stacking an AlN layer and an $Al_{0.27}Ga_{0.73}N$ layer one another for use as an intermediate layer.

Publication 1: M. Adachi et al., "Fabrication of Light Emitting Diodes with GaInN Multi-Quantum Wells on Si(111) Substrate by MOCVD", Proc. Int. Workshop on Nitride Semiconductors, IPAP Conf Series 1, pp. 868-871.

For the combination technique for performing lattice alignment, however, adequate studies have yet to be made. Based on the results of the inventors' studies, when a substrate such as a Si substrate having a smaller coefficient of thermal expansion than a nitride semiconductor film is employed, it would be difficult to grow a nitride semiconductor film of good quality and less dislocation by simply providing such an intermediate layer as described in the above publication. A light emitting layer fabricated on the film would suffer considerable dislocation, hindering implementation of a high-luminance light emitting device.

Further, when a nitride base semiconductor device is fabricated on a Si substrate, cracks would occur due to the difference in coefficient of thermal expansion when the fabricated film is cooled to room temperature. Thus, it has been found that it is important to employ hard AlN to reduce occurrence of such cracks.

In other words, when a substrate having a lattice constant different from that of and a coefficient of thermal expansion smaller than that of a nitride semiconductor film is being employed, it is necessary to grow an AlGaInN layer containing a large amount of AlN exhibiting high degrees of c-axis orientation and hardness. This AlGaInN intermediate layer, however, has a low lattice constant, due to AlN contained in such a large amount, and would apply large compressive strain to a GaInN light emitting layer constituting the light emitting device structural portion, thereby deteriorating its crystallinity and degrading the luminous efficiency.

For example, in the structure described in the above publication 1, an intermediate layer 102 is formed of an AlN layer 102a of a thickness of 120 nm (a-axis lattice constant: 0.3112 nm) and an $Al_{0.27}Ga_{0.73}N$ layer 102b of a thickness of 380 nm (a-axis lattice constant: 0.3168 nm) stacked one another on a Si substrate 101, as shown in FIGS. 5A and 5B. On the intermediate layer 102, a GaN layer 103 (a-axis lattice constant: 0.3189 nm) and a GaInN light emitting layer 106 are formed.

The lattice constant described herein is simply an a-axis lattice constant of a bulk, i.e., one theoretically calculated using the Vegard's Law, because an actual lattice constant would change according to deformation such as strain, thereby introducing discrepancies to the values.

FIGS. 5A and 5B respectively show a schematic cross section of the configuration of the semiconductor light emitting device described in the above publication 1 and the a-axis lattice constants of the respective layers in the bulk states.

As such, the lattice constant of AlGaInN base intermediate layer 102 can be increased by lowering the content of Al or increasing the content of Ga or In therein gradually or stepwise. The AlGaInN intermediate layer 102 of multi-layer structure thus permits lattice alignment from Si substrate 101 to GaN layer 103. Such an lattice alignment effect, however, is insufficient with only the multi-layer AlGaInN intermediate layer 102. Dislocation is obvious on this intermediate layer 102, making it difficult to grow GaN layer 103 of good quality. As such, when a light emitting layer 106 is formed on GaN layer 103 and a voltage is applied thereto, an unproductive leakage current not contributing to the emission of light emitting layer 106 would increase, hindering implementation of a high-luminance semiconductor light emitting device.

SUMMARY OF THE INVENTION

An object of the present invention is to provide a long-life and high-luminance nitride base semiconductor light emitting device, when a substrate such as a Si substrate having a smaller coefficient of thermal expansion than a nitride semiconductor film is employed, by suppressing occurrence of cracks and ensuring good crystallinity of the nitride semiconductor film.

The semiconductor light emitting device of the present invention is a semiconductor light emitting device having a gallium nitride base compound semiconductor layer expressed by a general formula of $In_xGa_yAl_zN$ (x+y+z=1, $0 \leq x \leq 1$, $0 \leq y \leq 1$, $0 \leq z \leq 1$), characterized in that it includes one intermediate layer between a first GaN layer and a light emitting layer and that the one intermediate layer has a lattice constant that is closer to a lattice constant of the light emitting layer than a lattice constant of the first GaN layer.

According to the semiconductor light emitting device of the present invention, provision of the one intermediate layer having a lattice constant closer to that of the light emitting layer than that of the first GaN layer permits sufficient lattice alignment, and thus effectively reduces strain applied to the light emitting layer. A first GaN layer of high quality, suppressed with occurrence of dislocation, can be obtained. Accordingly, it is possible to obtain a long-life and high-luminance semiconductor light emitting device.

Preferably, the semiconductor light emitting device described above is further provided with a substrate having a smaller coefficient of thermal expansion than GaN, and another intermediate layer formed between the substrate and the first GaN layer. The another intermediate layer has a lattice constant that is closer to the lattice constant of the first GaN layer than a lattice constant of the substrate.

The another intermediate layer permits lattice alignment between the substrate and the first GaN layer. Accordingly, it is possible to obtain a first GaN layer of high quality with occurrence of dislocation being suppressed.

Preferably, in the semiconductor light emitting device described above, the another intermediate layer includes an $Al_aGa_bIn_{1-a-b}N$ layer ($0 \leq a \leq 1$, $0 \leq d \leq 1$, $a+b \leq 1$).

Including the hard AlN layer in the another intermediate layer of $Al_aGa_bIn_{1-a-b}N$ layer prevents occurrence of cracks due to the difference in coefficient of thermal expansion.

Preferably, in the semiconductor light emitting device described above, the one intermediate layer includes an $IN_cGa_dAl_{1-c-d}N$ layer ($0<c \leq 1$, $0 \leq d \leq 1$, $c+d \leq 1$).

This allows the lattice constant of the one intermediate layer to come closer to that of the light emitting layer than that of the first GaN layer.

Preferably, in the semiconductor light emitting device described above, the $Al_aGa_bIn_{1-a-b}N$ layer has a plurality of layers of an $Al_eGa_fIn_{1-e-f}N$ layer ($0<e \leq 1$, $0 \leq f \leq 1$, $e+f \leq 1$) and an $Al_gGa_hIn_{1-g-h}N$ layer ($0<g \leq 1$, $0 \leq h \leq 1$, $g+h \leq 1$, $e<g$) sequentially stacked, and a lattice constant of the $Al_eGa_fIn_{1-e-f}N$ layer is smaller than that of the first GaN layer.

This assures high hardness and thus prevents cracks due to the difference in coefficient of thermal expansion. In addition, the lattice constant of the $Al_gGa_hIn_{1-g-h}N$ layer, rather than that of the $Al_eGa_fIn_{1-e-f}N$ layer, can be made closer to that of the GaN layer, so that a still further lattice alignment effect can be obtained.

Preferably, in the semiconductor light emitting device described above, the $Al_aGa_bIn_{1-a-b}N$ layer consists of a plurality of layers, and the plurality of layers each have a smaller Al composition ratio as it is closer to the first GaN layer.

Thus, high hardness is obtained, preventing cracks due to the difference in coefficient of thermal expansion. The lattice alignment effect also increases.

Preferably, the semiconductor light emitting device described above is further provided with a clad layer formed between the one intermediate layer and the light emitting layer. The clad layer includes at least one of a second GaN layer and an $In_iGa_{1-i}N$ layer ($0<i \leq 1$).

Forming the clad layer on the surface of the one intermediate layer poor in flatness improves the surface flatness, thereby preventing generation of a leakage current. In addition, a carrier block effect is obtained by forming the clad layer.

Preferably, in the semiconductor light emitting device described above, the clad layer has a film thickness of not less than 10 nm and not more than 30 nm.

This provides the effect of improving the surface flatness.

If the clad layer is thinner than 10 nm, the effect of improving the surface flatness would not be expected sufficiently. If it is thicker than 30 nm, strain on the intermediate layer would be recovered by the GaN layer, which adversely affects the quality of the light emitting layer.

Preferably, in the semiconductor light emitting device described above, the $In_cGa_dAl_{1-c-d}N$ layer consists of a plurality of layers, and the plurality of layers each have a smaller In composition ratio as it is closer to the light emitting layer.

This assures a more remarkable lattice alignment effect.

Preferably, in the semiconductor light emitting device described above, the $Al_aGa_bIn_{1-a-b}N$ layer has a film thickness of not less than 10 nm and not more than 500 nm.

If the $Al_aGa_bIn_{1-a-b}N$ layer is thinner than 10 nm, the c-axis orientation of the clad layer would be degraded, which makes the crystal coarse, hindering implementation of a high-luminance semiconductor light emitting device. If the $Al_aGa_bIn_{1-a-b}N$ layer is thicker than 500 nm, although the lattice constant change might be modest, the total thickness of the light emitting device structure would increase. As a result, strain attributable to the difference in coefficient of thermal expansion between the substrate and the GaN layer would increase, and cracks would also occur. This leads to an increase of the leakage current of the semiconductor light emitting device, making it difficult to fabricate a high-luminance semiconductor light emitting device.

Preferably, in the semiconductor light emitting device described above, the $In_cGa_dAl_{1-c-d}N$ layer has a film thickness of not less than 200 nm and not more than 400 nm.

If the $In_cGa_dAl_{1-c-d}N$ layer is thinner than 200 nm, a sufficient lattice alignment effect would not be expected. This lessens the effect of decreasing the strain, thereby hindering implementation of a high-luminance semiconductor light emitting device.

If the $In_cGa_dAl_{1-c-d}N$ layer is thicker than 400 nm, the total thickness of the light emitting device structure on the substrate would increase. Cracks would occur, and the leakage current of the semiconductor light emitting device would increase, as described above, making it difficult to fabricate a high-luminance semiconductor light emitting device.

Preferably, in the semiconductor light emitting device described above, a ratio of the In content to the Ga content in the $In_cGa_dAl_{1-c-d}N$ layer is not more than 10%.

BRIEF DESCRIPTION OF THE DRAWINGS

FIGS. 5A and 5B respectively show a schematic cross section of a configuration of a conventional semiconductor light emitting device, and a-axis lattice constants of the respective layers.

DESCRIPTION OF THE PREFERRED EMBODIMENTS

Hereinafter, embodiments of the present invention will be described with reference to the drawings.

First Embodiment

Figure 1:
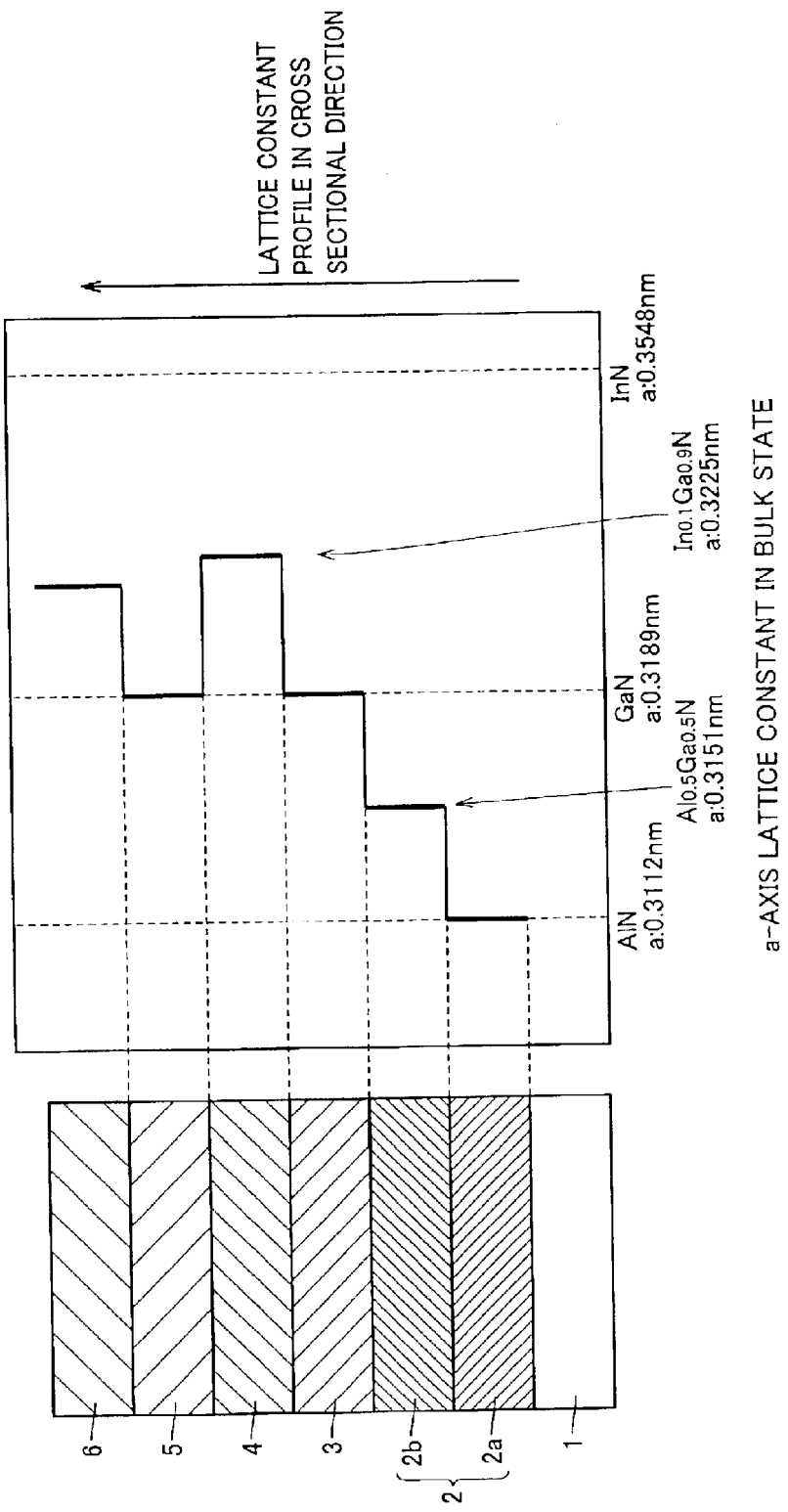
FIGS. 1A and 1B respectively show a schematic cross section of a configuration of the semiconductor light emitting device according to a first embodiment of the present invention, and a-axis lattice constants of the respective layers.

Referring to FIGS. 1A and 1B, a first intermediate layer 2 (corresponding to the "another intermediate layer") is formed on a Si substrate 1. First intermediate layer 2 has an AlN intermediate layer 2a (a-axis lattice constant: 0.3112 nm) of a thickness of, e.g., 200 nm, and an $Al_{0.5}Ga_{0.5}N$ intermediate layer 2b (a-axis lattice constant: 0.3151 nm) of a thickness of, e.g., 150 nm having the Al content lowered from that of AlN intermediate layer 2a. On first intermediate layer 2, a GaN layer 3 (a-axis lattice constant: 0.3189 nm), serving as an underlayer substrate, is formed to a thickness of, e.g., 1 $\mu$m. Formed on GaN layer 3 by adding In elements thereto is an $In_{0.1}Ga_{0.9}N$ base, second intermediate layer 4 (corresponding to the "one intermediate layer") (a-axis lattice constant: 0.3225 nm) of a thickness of, e.g., 300 nm, which has a lattice constant greater than that of the GaN layer. On second intermediate layer 4, an $In_{0.03}Ga_{0.97}N$ clad layer 5 (a-axis lattice constant: 0.3200 nm) with the In content decreased again, is formed to a thickness of, e.g., 20 nm. On clad layer 5, an AlGaIn base light emitting layer 6 (a-axis lattice constant: 0.3221 nm) and a carrier block layer (not shown) are formed. A semiconductor light emitting device structure is thus obtained.

As described above, when a substrate having a coefficient of thermal expansion smaller than that of a nitride semiconductor film is employed, the AlN layer 2a is indispensable to increase the c-axis orientation to prevent occurrence of cracks. However, as an offset thereof, GaN layer 3 as the underlayer substrate inevitably suffers strain. Thus, the content of AlN is decreased gradually or stepwise in intermediate layer 2 to achieve fitting of the lattice constant to the underlayer GaN layer 3.

With this fitting technique only, however, the lattice constant of intermediate layer 2 is still dominant, and the strain is still governed by the AlN base mixed crystal film. To significantly lessen such strain, second intermediate layer 4 having a lattice constant greater than that of GaN layer 3 is used to change the lattice constant gradually or stepwise. This prevents large compressive strain from occurring to light emitting layer 6. Accordingly, strain applied to light emitting layer 6 can be reduced effectively, and high-quality GaN layer 3 with occurrence of dislocation suppressed can be obtained.

It is considered that use of clad layer 5 as the final layer beneath light emitting layer 6 is advantageous from the standpoint of recovering flatness. In other words, when clad layer 5 is made to have a composition (e.g., $In_{0.03}Ga_{0.97}N$) closer to that of the GaN layer, the growth temperature can be set high, making it possible to improve the flatness. Clad layer 5 also has a carrier block effect in the band structure.

Although the lattice constant of clad layer 5 in the bulk state is farther from the lattice constant of light emitting layer 6 than that of second intermediate layer 4, clad layer 5 is kept thin, and thus, the lattice constant of clad layer 5 is greatly affected by the lattice constant of the underlayer and it comes closer to the lattice constant of second intermediate layer 4. Thus, clad layer 5 would not impair the lattice alignment effect.

GaN layer 3 is formed with superior flatness, and has a good effect of blocking carriers in the band structure.

As such, occurrence of cracks is prevented, strain applied to light emitting layer 6 is effectively reduced, and high-quality GaN layer 3 suffering less dislocation can be obtained. Accordingly, it is possible to obtain a long-life and high-luminance semiconductor light emitting device.

Figure 2:
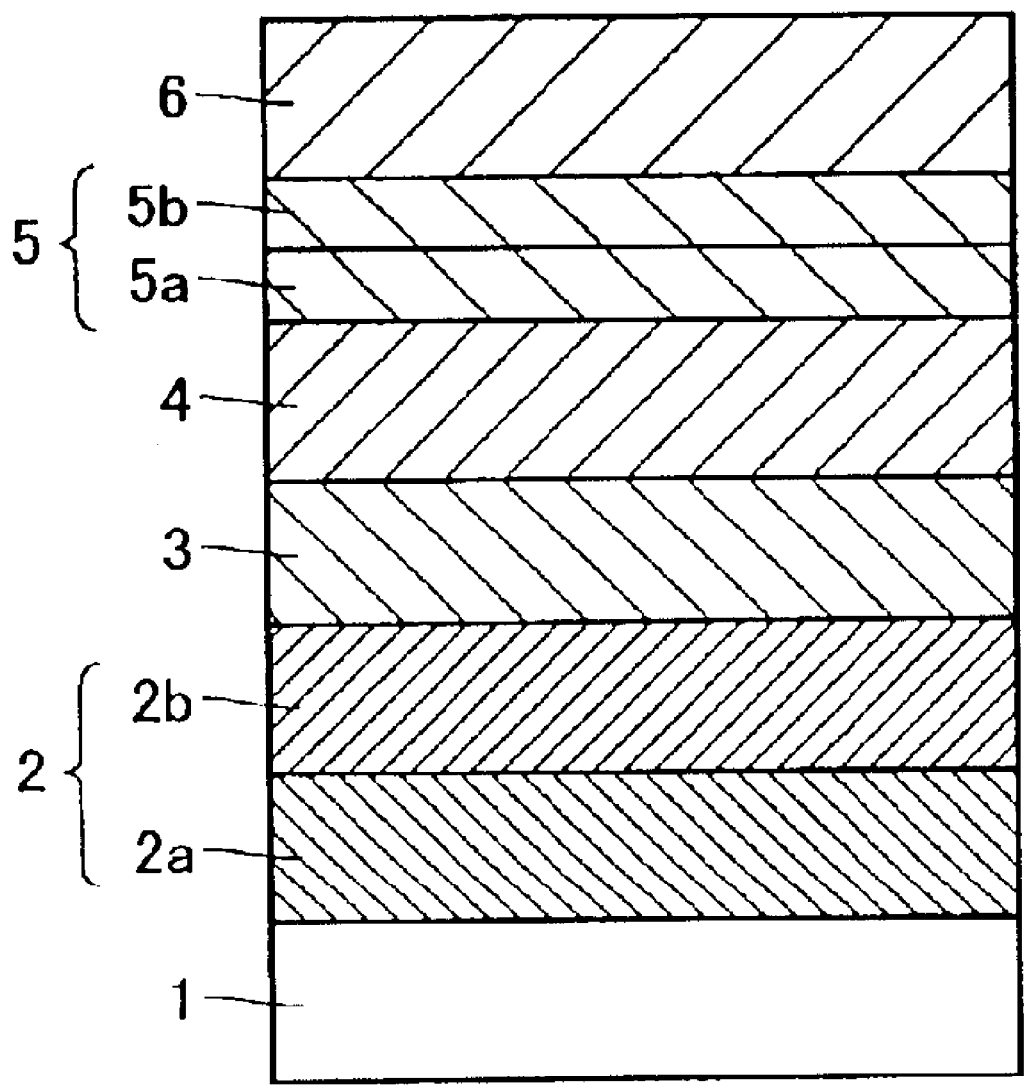
FIG. 2 is a cross section schematically showing another configuration of the semiconductor light emitting device according to the first embodiment of the present invention.

Although clad layer 5 has been described as a single, $In_cGa_{1-c}N$ layer ($0<c\leq1$), it may be a single, GaN layer. Alternatively, it may have a stacked structure of GaN layer 5a and $In_hGa_{1-h}N$ layer ($0\leq h\leq1$) 5b, as shown in FIG. 2.

Second Embodiment

Figure 3:
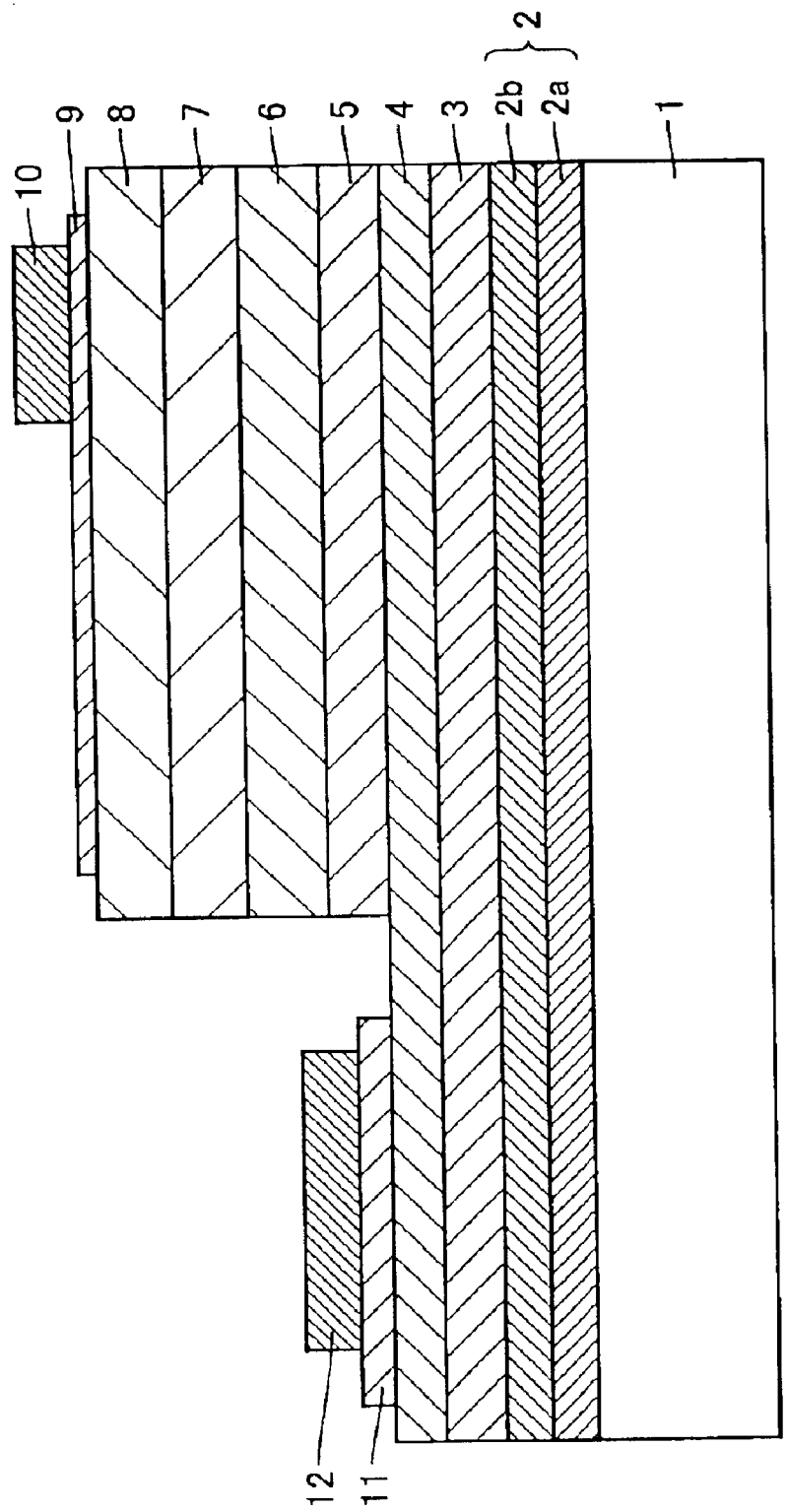
FIG. 3 is a cross section showing a specific configuration of the semiconductor light emitting device according to a second embodiment of the present invention.

Referring to FIG. 3, the nitride semiconductor light emitting device of the present embodiment has a multi-layer structure of an AlN layer 2a, an $Al_{0.5}Ga_{0.5}N$ layer 2b, a Si-doped n type GaN layer 3, a Si-doped n type $In_{0.1}Ga_{0.9}N$ layer 4, a Si-doped n type $In_{0.03}Ga_{0.97}N$ first clad layer 5, an $In_xGa_{1-x}N$ light emitting layer 6, a p type AlGaInN carrier block layer 7, and a p type GaN second clad layer 8, sequentially stacked one another on a Si substrate 1.

P type GaN layer 8, carrier block layer 7, light emitting layer 6 formed of multiple quantum wells (MQW), and clad layer 5 are partially removed by photolithography and reactive ion etching (RIE), to expose a portion of the surface of n type $In_{0.1}Ga_{0.9}N$ layer 4.

A bonding electrode 10 is electrically connected to the upper surface of second clad layer 8 with a transparent electrode 9 interposed therebetween. A bonding electrode 12 is electrically connected to n type $In_{0.1}Ga_{0.9}N$ layer 4 with a transparent electrode 11 interposed therebetween.

Here, although light emitting layer 6 may have its content x of $In_xGa_{1-x}N$ changed to cause the interband emission wavelengths to emit from ultraviolet to red, it is set to emit blue in the present embodiment. The effects of the present invention can also be obtained when light emitting layer 6 is formed of any of III–V group nitride base semiconductors primarily containing N as the V group element such as InGaAlN, GaAsN, GaInAsN, GaPN, GaInPN and others.

Here, metal is preferably used for transparent electrode 11 connected to n type $In_{0.1}Ga_{0.9}N$ layer 4. The metal preferably includes any of Al, Ti, Zr, Hf, V and Nb. A metal film having a thickness of not more than 20 nm may be used as transparent electrode 9 connected to second clad layer 8. The metal preferably includes any of Ta, Co, Rh, Ni, Pd, Pt, Cu, Ag and Au.

Hereinafter, a manufacturing method of the semiconductor light emitting device of the present embodiment is described.

Referring to FIG. 3, firstly, Si substrate 1 slightly offset by about 1° is subjected to organic cleaning and then cleaned with a 5% HF (hydrogen fluoride) solution for one minute. It is then introduced into a metal organic chemical vapor deposition (MOCVD) apparatus, and subjected to high-temperature cleaning at about 900° C. within the hydrogen ($H_2$) atmosphere. Thereafter, $NH_3$ and trimethyl aluminum (TMA) are introduced at flow rates of 5 l/min and 20 $\mu$mol/min, respectively, at 1200° C., with $H_2$ as the carrier gas being flown at 10 l/min, and $SiH_4$ gas is further introduced to thereby form Si-doped AlN layer 2a to a thickness of 200 nm.

In crystal growth by metallorganic vapor phase epitaxy (MOVPE) this time, a flat film was obtained by introducing organic metal of the III group source material gas a few seconds prior to introduction of $NH_3$ gas as the V group source material. This is presumably because the advance introduction of the $NH_3$ gas prevents the Si surface from nitriding, and the III group elements are arranged on the Si outermost surface at the interface between Si and the nitride semiconductor, although the introducing timing of the gas varies dependent on the apparatuses.

Thereafter, $NH_3$, TMA and trimethyl gallium (TMG) are introduced at flow rates of 5 l/mm, 20 $\mu$mol/min and 20 $\mu$mol/min, respectively, at 1150° C., with $H_2$ as the carrier gas being flown at 10 l/min. $SiH_4$ gas is further introduced, and thus, Si-doped $Al_{0.5}Ga_{0.5}N$ layer 2b of a thickness of 150 nm is formed on AlN layer 2a.

Subsequently, $NH_3$ and TMG are introduced at flow rates of 5 l/min and 20 $\mu$mol/min, respectively, at 1150° C., with $H_2$ as the carrier gas being flown at 10 l/min. $SiH_4$ gas is further introduced, to form Si-doped GaN layer 3 of a thickness of 1 μm on $Al_{0.5}Ga_{0.5}N$ layer 2b.

After decreasing the growth temperature to 910° C., TMG and trimethyl indium (TMI) are introduced at about 20 μmol/min and 100 μmol/min, respectively, to form Si-doped $In_{0.1}Ga_{0.9}N$ layer 4 of a thickness of 300 nm on GaN layer 3.

Further, the flow rate of TMI is reduced to about 5 μmol/min, and Si-doped $In_{0.03}Ga_{0.97}N$ layer 5 is formed on $In_{0.1}Ga_{0.9}N$ layer 4 to a thickness of 20 nm.

Thereafter, the substrate temperature is decreased to 760° C., and TMI as the indium source material and TMG are introduced at 6.5 μmol/min and 2.08 μmol/min, respectively, to form a well layer of $In_{0.18}Ga_{0.82}N$ on $In_{0.03}Ga_{0.97}N$ layer 5 to a thickness of 3 nm. The temperature is then raised to 850° C., and TMG is introduced at 14 μmol/min to form a barrier layer of GaN. The growths of the well layer and the barrier layer are repeated to form InGaN light emitting layer 6 having the MQW structure consisting of four pairs of the layers.

Following the formation of light emitting layer 6, TMG, TMA and TMI are introduced at flow rates of 11 μmol/min, 1.1 μmol/min and 40 μmol/min, respectively, at the same temperature with the last barrier layer. A p type doping source material gas, biscyclopentadienylmagnesium (Cp2Mg), is further introduced at 10 nmol/min, to form p type carrier block layer 7 of Mg-doped $Al_{0.20}Ga_{0.75}In_{0.05}N$ layer to a thickness of 50 nm.

Following the formation of p type carrier block layer 7, the temperature is raised to 1000° C. and the supply of TMA is stopped, and p type second clad layer 8 of Ga-doped GaN layer is formed to a thickness of 100 nm. After the formation of each film, the supply of TMG and Cp2Mg is stopped, and the temperature is lowered to room temperature. The substrate having the films deposited thereon is taken out of the MOCVD apparatus.

Thereafter, photolithography and RIE are employed to partially etch p type GaN layer 8, carrier block layer 7, MQW light emitting layer 6 and clad layer 5 sequentially, so that a portion of the surface of n type $In_{0.1}Ga_{0.9}N$ layer 4 is exposed.

Transparent electrode 9 is then formed on the upper surface of second clad layer 8, and bonding electrode 10 is formed on a portion of transparent electrode 9. Electrode 11 is formed on the upper surface of n type $In_{0.1}Ga_{0.9}N$ layer 4, and bonding electrode 12 is formed on a portion of electrode 11. Thereafter, a dicing apparatus is employed to divide the substrate into 300 μm-squares, so that the semiconductor light emitting device of the present embodiment is completed.

Here, the configurations of AlGaInN base first and second intermediate layers 2, 4 are explained.

AlGaInN base first intermediate layer 2 between Si substrate 1 and n type GaN layer 3 preferably had a total thickness of not less than 10 nm and not more than 500 nm. When first intermediate layer 2 was thinner than 10 nm, the c-axis orientation of the GaN clad layer on the first intermediate layer 2 would be degraded. This would make the crystal coarse, thereby hindering implementation of a high-luminance semiconductor light emitting device. When first intermediate layer 2 was thicker than 500 nm, the lattice constant change would be modest, which might be effective for lattice alignment to the GaN clad layer. However, the total thickness of the light emitting device structure on Si substrate 1 would be large, thereby increasing the strain attributable to the difference in coefficient of thermal expansion between Si substrate 1 and the nitride semiconductor film. As a result, cracks would occur, and the leakage current of the semiconductor light emitting device would increase, making it difficult to fabricate a high-luminance semiconductor device.

The effective thickness range of $In_uGa_vAl_wN$ base second intermediate layer 4 (u+v+w=1) on n type GaN layer 3 was from 200 nm to 400 nm, although the experiments were conducted with w=0 in the present embodiment.

When $In_uGa_vAl_wN$ base second intermediate layer 4 (u+v+w=1, w=0) was thinner than 200 nm, the lattice constant of second intermediate layer 4 would be likely to change to approach the lattice constant of the underlayer. This would lessen the effect of decreasing the strain, thereby hindering implementation of a high-luminance semiconductor light emitting device.

When second intermediate layer 4 was thicker than 400 nm, the total thickness of the light emitting device structure on Si substrate 1 would increase. As a result, cracks would occur, and the leakage current of the semiconductor light emitting device would increase, as described above, thereby making it difficult to fabricate a high-luminance semiconductor light emitting device.

The composition of $In_uGa_vAl_wN$ base second intermediate layer 4 (u+v+w=1, w=0) is closely related to the composition of light emitting layer 6. If light emitting layer 6 becomes longer wavelength and higher composition, the content of u in $In_uGa_vAl_wN$ base second intermediate layer 4 (u+v+w=1, w=0) would have to be increased correspondingly. With such an increased content of u, however, a flat film was not obtained, presumably because crystallinity of the layer was degraded. Thus, taking the flatness of second intermediate layer 4 into consideration, the upper limit of the content of u was 15%, and that in a range from 5% to 10% was appropriate. The lattice constant of second intermediate layer 4 at this time was from 0.3207 nm to 0.3512 nm.

When the difference in lattice constant between second intermediate layer 4 (lattice constant: a1) and the underlying GaN layer 3 (lattice constant: a0) is defined as $\Delta a=(a1-a0)/a0$, $\Delta a$ in a range from 0.5% to 10% was effective to obtain the above-described effects.

In the present embodiment, clad layer 5 is stacked on second intermediate layer 4 for the following reasons.

Since $In_uGa_vAl_wN$ base second intermediate layer 4 (u+v+w=1, w=0) beneath clad layer 5 is irregular, if light emitting layer 6, carrier block layer 7 and second clad layer 8 are stacked directly thereon, the flatness of those layers would be degraded. In such a case, the leakage current in the device structure would increase, hindering implementation of a light emitting device of desirable characteristics. Thus, clad layer 5 is employed to ensure flatness of the surface on which light emitting layer 6 is formed. Clad layer 5 required a thickness of not less than 10 nm and not more than 30 nm.

If clad layer 5 is thinner than 10 nm, needless to say, the effect of ensuring flatness described above would be lessened. If clad layer 5 is thicker than 30 nm, strain on the intermediate layer would be recovered by the GaN layer, which strain would adversely affect the quality of the light emitting layer.

As to the composition of $In_cGa_{1-c}N$ clad layer 5, the c in a range from 0% to 3% produced a desirable result. The lattice constant of $In_cGa_{1-c}N$ clad layer 5 was not less than 0.3189 nm and not more than 0.3200 nm.

Third Embodiment

In the present embodiment, a quaternary system mixed crystal layer containing Al is used as $In_uGa_vAl_wN$ base second intermediate layer 4 (u+v+w=1). The lattice constant of this quaternary system mixed crystal layer containing Al, examined by conducting an experiment based on the second embodiment, showed that it made no difference in terms of a-axis value from the lattice constant of the second intermediate layer 4 of the second embodiment. When $Al_{0.05}Ga_{0.85}In_{0.1}N$ (a:0.3221 nm) was used as the quaternary system mixed crystal layer containing Al, Δa was 1%. As such, the configuration employing $In_uGa_vAl_wN$ base second intermediate layer 4 (u+v+w=1) containing Al has its Δa falling into the range (0.5≦Δa≦10) of the second embodiment. Accordingly, the present embodiment enjoys the same effects as in the second embodiment.

Fourth Embodiment

Figure 4:
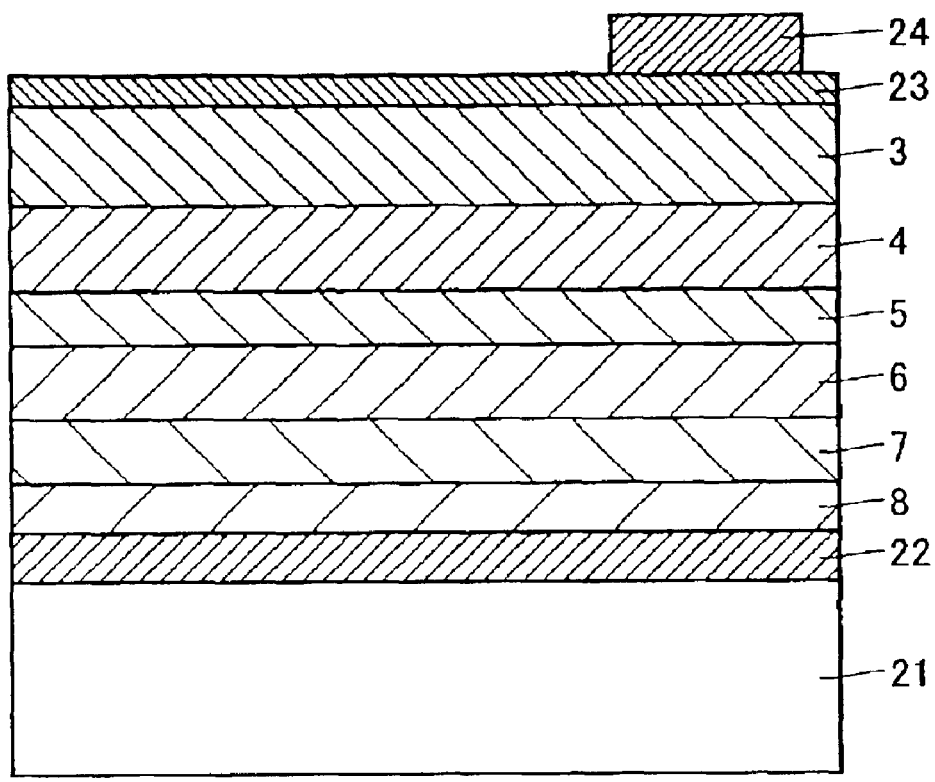
FIG. 4 is a cross section showing a specific configuration of the semiconductor light emitting device according to a fourth embodiment of the present invention.

Referring to FIG. 4, the semiconductor light emitting device of the present embodiment has a multi-layer structure of Si-doped n type GaN layer 3, Si-doped n type $In_{0.1}Ga_{0.9}N$ layer 4, Si-doped n type $In_{0.03}Ga_{0.97}N$ first clad layer 5, $In_xGa_{1-x}N$ light emitting layer 6, p type AlGaInN carrier block layer 7, and p type GaN second clad layer 8, as fabricated in the second embodiment, sequentially stacked one another.

An Ni-plated film 21 is electrically connected to second clad layer 8 with a p type electrode 22 interposed therebetween. A bonding electrode 24 is formed on n type GaN layer 3 with a transparent electrode 23 interposed therebetween.

Now, a manufacturing method of the semiconductor light emitting device of the present embodiment is described.

After the substrate having the films deposited thereon is taken out of the MOCVD apparatus in the manufacturing method of the first embodiment, p type electrode 22 is formed on the surface of second clad layer 8 by EB (electron beam) vapor deposition to a thickness of 200 nm. Subsequently, Ni-plated film 21 is formed by plating, on p type electrode 22 to a thickness of 300 μm. Thereafter, Si substrate 1 is removed by a hydrofluoric acid base etchant, and AlN layer 2a and $Al_{0.5}Ga_{0.5}N$ layer 2b as high-resistance first intermediate layer 2 are etched by RIE. The surface of n type GaN layer 3 is thus exposed.

It is noted that a low-resistance layer is preferable as a contact with an n type electrode. In this regard, it is natural to etch the intermediate layer containing Al in a large amount to obtain a light emitting device having low contact resistance on the n side.

Further, transparent electrode 23 is formed on GaN layer 3, and bonding electrode 24 is formed on a portion of transparent electrode 23. Thereafter, a dicing apparatus is employed to divide the substrate into 250-μm-squares, so that the semiconductor light emitting device shown in FIG. 4 is completed.

Although first intermediate layer 2 is unseen in the appearance of the final product shown in FIG. 4, it is important to form first intermediate layer 2 prior to formation of the films thereon, to obtain the high-quality films.

As described above, according to the semiconductor light emitting device of the present invention, one intermediate layer having a lattice constant closer to that of the light emitting layer than that of the first GaN layer is provided, which assures sufficient lattice alignment. Strain applied to the light emitting layer is effectively decreased, and the first GaN layer of high quality is obtained with occurrence of dislocation suppressed. Accordingly, a long-life and high-luminance semiconductor light emitting device is obtained.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

What is claimed is:

1. A semiconductor light emitting device having a gallium nitride base compound semiconductor layer expressed by a general formula of $In_xGa_yAl_zN$ (x+y+z=1, 0≦x≦1, 0≦y≦1, 0≦z≦1), comprising:

one intermediate layer between a first GaN layer and a light emitting layer;

said one intermediate layer having a lattice constant that is closer to a lattice constant of said light emitting layer than a lattice constant of said first GaN layer.

2. The semiconductor light emitting device according to claim 1, further comprising:

a substrate having a smaller coefficient of thermal expansion than GaN; and another intermediate layer formed between said substrate and said first GaN layer;

said another intermediate layer having a lattice constant that is closer to the lattice constant of said first GaN layer than a lattice constant of said substrate.

3. The semiconductor light emitting device according to claim 2, wherein said another intermediate layer includes an $Al_aGa_bIn_{1-a-b}N$ layer (0<a≦1, 0≦b≦1, a+b≦1).

4. The semiconductor light emitting device according to claim 3, wherein said $Al_aGa_bIn_{1-a-b}N$ layer includes a plurality of layers of an $Al_eGa_fIn_{1-e-f}N$ layer (0<e≦1, 0≦f≦1, e+f≦1) and an $Al_gGa_hIn_{1-g-h}N$ layer (0<g≦1, 0≦h≦1, g+h≦1, e>g) sequentially stacked, and a lattice constant of said $Al_eGa_bIn_{1-a-b}N$ layer is smaller than the lattice constant of said first GaN layer.

5. The semiconductor light emitting device according to claim 3, wherein said $Al_aGa_bIn_{1-a-b}N$ layer consists of a plurality of layers, and said plurality of layers each have a smaller Al composition ratio as it is closer to said first GaN layer.

6. The semiconductor light emitting device according to claim 3, wherein said $Al_aGa_bIn_{1-a-b}N$ layer has a film thickness of not less than 10 nm and not more than 500 nm.

7. The semiconductor light emitting device according to claim 1, wherein said one intermediate layer includes an $In_cGa_dAl_{1-c-d}N$ layer (0<c≦1, 0≦d≦1, c+d≦1).

8. The semiconductor light emitting device according to claim 7, wherein said $In_cGa_dAl_{1-c-d}N$ layer consists of a plurality of layers, and said plurality of layers each have a smaller In composition ratio as it is closer to said light emitting layer.

9. The semiconductor light emitting device according to claim 7, wherein said $In_cGa_dAl_{1-c-d}N$ layer has a film thickness of not less than 200 nm and not more than 400 nm.

10. The semiconductor light emitting device according to claim 7, wherein a ratio of the In content to the Ga content in said $In_cGa_dAl_{1-c-d}N$ layer is not more than 10%.

11. The semiconductor light emitting device according to claim 1, further comprising a clad layer formed between said one intermediate layer and said light emitting layer, said clad layer including at least one of a second GaN layer and an $In_iGa_{1-i}N$ layer (0<i≦1).

12. The semiconductor light emitting device according to claim 11, wherein said clad layer bas a film thickness of not less than 10 nm and not more than 30 nm.

* * * * *